United States Patent
Eto et al.

(10) Patent No.: US 6,195,304 B1
(45) Date of Patent: Feb. 27, 2001

(54) SEMICONDUCTOR MEMORY DEVICE AND ITS REFRESH ADDRESS SIGNAL GENERATING METHOD ADAPTED TO REDUCE POWER CONSUMPTION DURING REFRESH OPERATION

(75) Inventors: Satoshi Eto; Masato Matsuyima; Kuninori Kawabata; Akira Kikutake, all of Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/500,814

(22) Filed: Feb. 10, 2000

(30) Foreign Application Priority Data

Apr. 16, 1999 (JP) .................................................. 11-109929

(51) Int. Cl.⁷ ...................................................... G11C 7/00
(52) U.S. Cl. ............................................ 365/222; 365/236
(58) Field of Search .................................... 365/222, 236, 365/189.01, 230.01

(56) References Cited

U.S. PATENT DOCUMENTS 5,959,925 * 9/1999 Tatsumi ................................ 365/222
5,991,851 * 11/1999 Alwais et al. ........................ 711/106

* cited by examiner

Primary Examiner—David Nelms
Assistant Examiner—Hoal V. Ho
(74) Attorney, Agent, or Firm—Arent Fox Kintner Plotkin & Kahn, PLLC

(57) ABSTRACT

A semiconductor memory device includes a memory cell array having a number of memory cells configured in a square or rectangular formation, the memory cell array having predetermined capacitive loads which are different at different memory locations, the capacitive loads including a smallest capacitive load and a largest capacitive load. A refresh address counter outputs a number of bit signals which constitute a refresh address signal, the refresh address signal indicating an address of a memory cell to be refreshed in the memory device, the bit signals having predetermined high/low-state change periods which are different from each other, the bit signals including a first bit signal corresponding to the smallest capacitive load and a second bit signal corresponding to the largest capacitive load. A selector is provided to connect the refresh address counter outputs to the memory cell array, and assigns the predetermined high/low-state change periods for the respective bit signals of the refresh address signal in accordance with a correspondence between the bit signals and the capacitive loads. A refresh address signal generating method is also disclosed for use in the semiconductor memory device.

5 Claims, 6 Drawing Sheets

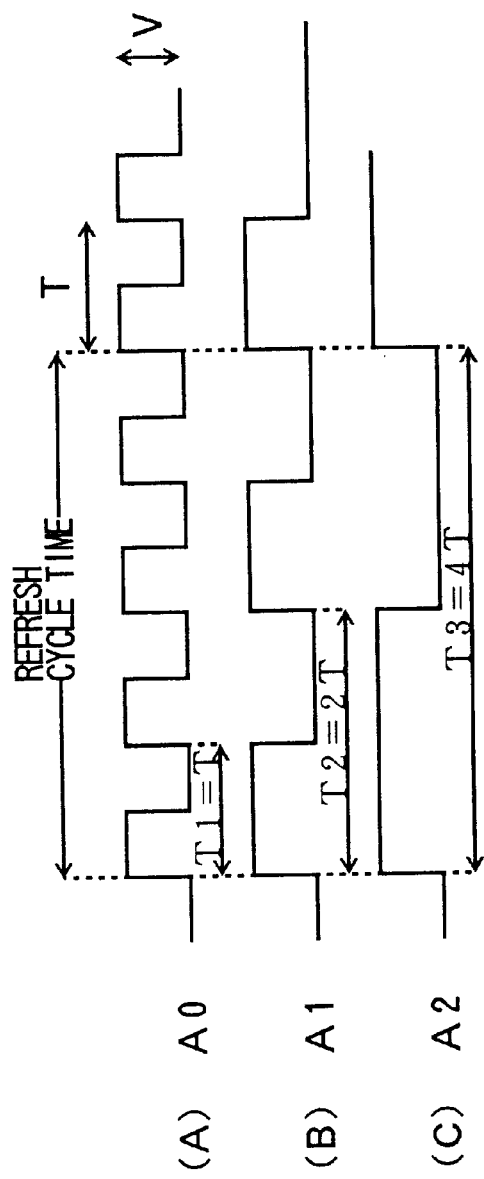

CAPACITIVE LOADS:
MA1<MA2<MA0

SEMICONDUCTOR MEMORY DEVICE AND ITS REFRESH ADDRESS SIGNAL GENERATING METHOD ADAPTED TO REDUCE POWER CONSUMPTION DURING REFRESH OPERATION

BACKGROUND OF THE INVENTION (1) Field of the Invention

The present invention relates to a semiconductor memory device in which memory cells are periodically read, sensed and re-written to an activated level, as well as to a refresh address signal generating method for use in the semiconductor memory device during the refresh operation.

(2) Description of the Related Art

Dynamic random access memories (DRAM), such as those comprised of metal oxide semiconductor field effect transistors (MOSFET), are widely used in various computers and portable electronic systems. Typically, as for a DRAM, an array of memory cells is fabricated on a single integrated circuit chip, each of the memory cells including an access transistor and a storage capacitor.

In a one-device DRAM memory cell, the value of the memory bit is represented by a voltage stored on the cell's capacitor. This voltage is written into the storage capacitor by asserting the word line such that the transistor is turned ON. The desired data state is then imposed on the bit line. Typically, this will be either 5V to represent a "1" or 0V to represent a "0". Since the transistor is ON, this voltage will be transferred onto the capacitor. Next, the word line voltage is returned to a low voltage, which turns the transistor OFF, isolating the charge on the capacitor.

To read the information from the memory cell described above, the word line is again asserted after the bit line has been connected to the input of a sense amplifier circuit. The charge from the capacitor is then transferred to the sense amplifier, where it can be detected as a "1" or a "0". This readout procedure is destructive, since it disturbs the information in the storage capacitor. Hence, the read operation must be followed by a subsequent write operation. Charge stored on the memory cell's capacitor does not remain on the capacitor indefinitely. Due to a variety of leakage paths, the charge eventually leak, off the capacitor, causing the memory cell to loose its information. To alleviate this problem, each memory cell in the DRAM must be periodically read, sensed, and re-written to a full level. Hereinafter, this periodical read/write procedure for the DRAM will be called the refresh operation.

To provide high packing density of the cells in the DRAM and to allow hierarchical addressing, the memory cells are physically configured in a square or rectangular array on the integrated circuit chip. A single bit line is shared by many memory cells. Also, a single word line is shared by many memory cells. By running the word and bit lines in orthogonal directions, only one memory cell shares the combination of a given word and bit line. This orthogonal configuration of control lines allows a two-level hierarchical addressing scheme. One level selects a single word line (which is called a row). The second addressing level selects a single bit line (which is called a column). Theoretically, a 4M DRAM array could be constructed of 2K word lines and 2K bit lines.

To refresh the memory cell array in the DRAM, one simply selects a word line, activates the sense amplifiers, and deselects the word lines. This must be repeated for all word lines in the chip at least once every refresh cycle. Generally, it is necessary to always start a subsequent refresh operation from the memory cell which was first refreshed during the previous refresh cycle, and to sequentially increment the address of the memory cell to be refreshed, in order to keep all the memory cells of the chip at the activated levels.

FIG. 1 is a time chart for explaining the above-mentioned refresh operation of the DRAM. For the sake of simplicity of description, suppose that a 3-bit refresh address signal is used to indicate a specific location of the memory cell to be refreshed in the memory device.

In FIG. 1, (A) indicates a bit signal A0 having a first high/low-state change period T1, (B) indicates a bit signal A1 having a second high/low-state change period T2 which is twice the period T1, and (C) indicates a bit signal A2 having a third high/low-state change period T3 which is four times the period T1. These bit signals A2, A1 and A0 constitute the 3-bit refresh address signal (A2,A1,A0).

In a case of the refresh operation of FIG. 1, the refresh operation is started from the memory cell at (0,0,0) and the address of the memory cell to be refreshed is incremented in the sequence of (0,0,0), (0,0,1), (0,1,0), . . . , (1,1,1), so as to refresh all the memory cells of the semiconductor memory device once every refresh cycle. Hence, a subsequent refresh operation is always started from the memory cell which was first refreshed during the previous refresh cycle, and the address of the memory cell to be refreshed is sequentially incremented.

However, in the case of the refresh operation of FIG. 1, the variations of the capacitive load of the memory device at different memory addresses are not taken into account. The bit signals A2, A1 and A0 are assigned for the refresh address signal in a fixed manner, and the address of the memory cell to be refreshed in the memory device is sequentially incremented with the refresh address signal. If the capacitive load of the memory device at the address of the first memory cell (or at (0,0,0) in the above case) from which the refresh operation is started is the largest, the power consumption required for the DRAM during the refresh operation will be significantly increased. The power consumption of the DRAM affects the overall system density or portability of the overall memory system. Due to a large number of storage elements in a main memory system, if a significant power is used by each individual memory cell, a special cooling mechanism will be required to remove the heat from the system. This increases the cost and reduces the density of the overall system.

SUMMARY OF THE INVENTION

An object of the present invention is to provide an improved semiconductor memory device in which the above-mentioned problems are eliminated.

Another object of the present invention is to provide a semiconductor memory device which effectively reduces the power consumption needed when performing the refresh operation by improving the generation of the refresh address signal.

Another object of the present invention is to provide an improved refresh address signal generating method which effectively reduces the power consumption required for a semiconductor memory device when performing the refresh operation.

The above-mentioned objects of the present invention are achieved by a semiconductor memory device in which memory cells are periodically refreshed to an activated level, the semiconductor memory device including: a memory cell array which has a number of memory cells configured in a square or rectangular formation, the memory cell array having predetermined capacitive loads which are different at different memory locations, the capacitive loads including a smallest capacitive load and a largest capacitive load; a refresh address counter which outputs a number of bit signals which constitute a refresh address signal, the refresh address signal indicating an address of a memory cell to be refreshed in the memory device, the bit signals having predetermined high/low-state change periods which are different from each other, the bit signals including a first bit signal corresponding to the smallest capacitive load and a second bit signal corresponding to the largest capacitive load; and a selector which is provided to connect the outputs of the refresh address counter to the memory cell array and assigns the predetermined high/low-state change periods for the respective bit signals of the refresh address signal in accordance with a correspondence between the bit signals and the capacitive loads such that a smallest high/low-state change period is assigned for the first bit signal corresponding to the smallest capacitive load and a largest high/low-state change period is assigned for the second bit signal corresponding to the largest capacitive load.

The above-mentioned objects of the present invention are achieved by a semiconductor memory device in which memory cells are periodically refreshed to an activated level, the semiconductor memory device including: a memory cell array which has a number of memory cells configured in rows and columns, the memory cell array having predetermined capacitive loads which are different at different memory locations, the capacitive loads including a smallest capacitive load and a largest capacitive load; a refresh address counter which outputs a number of bit signals which constitute a refresh address signal, the refresh address signal indicating a row address of a memory cell to be refreshed in the memory device, the bit signals having predetermined high/low-state change periods which are different from each other, the bit signals including a first bit signal corresponding to the smallest capacitive load and a second bit signal corresponding to the largest capacitive load; and a wiring pattern which connects the outputs of the refresh address counter to the memory cell array to assign the predetermined high/low-state change periods for the respective bit signals of the refresh address signal in accordance with a correspondence between the bit signals and the capacitive loads.

The above-mentioned objects of the present invention are achieved by a refresh address signal generating method for periodically refreshing a semiconductor memory device to an activated level within a refresh cycle time, the method including the steps of: providing a memory cell array having a number of memory cells configured in a square or rectangular formation, the memory cell array having predetermined capacitive loads which are different at different memory locations, the capacitive loads including a smallest capacitive load and a largest capacitive load; outputting a number of bit signals which constitute a refresh address signal, the refresh address signal indicating an address of a memory cell to be refreshed in the memory device, the bit signals having predetermined high/low-state change periods which are different from each other, the bit signals including a first bit signal corresponding to the smallest capacitive load and a second bit signal corresponding to the largest capacitive load; and assigning the predetermined high/low-state change periods for the respective bit signals of the refresh address signal in accordance with a correspondence between the bit signals and the capacitive loads such that a smallest high/low-state change period is assigned for the first bit signal corresponding to the smallest capacitive load and a largest high/low-state change period is assigned for the second bit signal corresponding to the largest capacitive load.

In the semiconductor memory device and the refresh address signal generating method according to the present invention, the predetermined high/low-state change periods are assigned for the respective bit signals of the refresh address signal in accordance with the correspondence between the bit signals and the capacitive loads such that the smallest high/low-state change period is assigned for the first bit signal corresponding to the smallest capacitive load and the largest high/low-state change period is assigned for the second bit signal corresponding to the largest capacitive load. The semiconductor memory device and the refresh address signal generating method of the present invention are effective in reduces the power consumption required for the semiconductor memory device when performing the refresh operation. The reduction of the power consumption according to the present invention makes it possible to increase an useful life of a portable electronic system which incorporates the semiconductor memory device of the present invention.

BRIEF DESCRIPTION OF THE DRAWINGS

Other objects, features and advantages of the present invention will be more apparent from the following detailed description when read in conjunction with the accompanying drawings in which:

FIG. 2 is a time chart for explaining the principal concepts of the present invention;

DETAILED DESCRIPTION OF THE PREFERRED EMBODIMENTS

Figure 1:
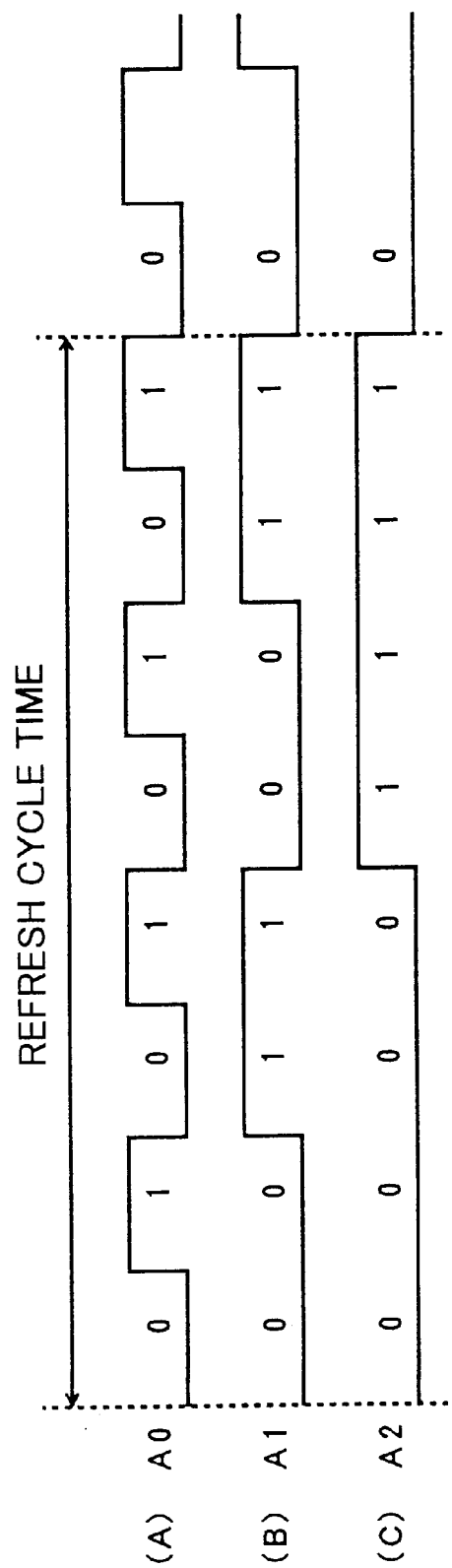
FIG. 1 is a time chart for explaining a refresh operation of a semiconductor memory device.

Before describing the preferred embodiments of the present invention, the principal concepts of the present invention will be described with reference to the accompanying drawings of FIG. 2 through FIG. 4B, for the sake of providing a good understanding of the present invention.

FIG. 2 is a diagram for explaining the principal concepts of the present invention. Suppose that a 3-bit refresh address signal is used to represent a specific address of the memory cell to be refreshed in a semiconductor memory device according to the present invention when performing the refresh operation.

In FIG. 2, (A) indicates a bit signal A0 having a first high/low-state change period T1 and an amplitude V, (B) indicates a bit signal A1 having a second high/low-state change period T2 and the same amplitude V, and (C) indicates a bit signal A2 having a third high/low-state change period T3 and the same amplitude V. These bit signals are output by a refresh address counter of the semiconductor memory device, and they constitute the refresh address signal according to the present invention.

The smallest high/low-state change period T indicated in FIG. 2 is equal to the change period T1 of the bit signal A0. The bit signal A0 initially has the smallest change period T (T1=T), and four cycles of the bit signal T1 are contained within a refresh cycle time. The bit signal A1 initially has the middle change period 2T (T2=2T), and two cycles of the bit signal A1 are contained within the refresh cycle time. The bit signal A2 initially has the largest change period 4T (T3=4T), and only one cycle of the bit signal A2 is contained within the refresh cycle time.

For the purpose of simplicity of description about the refresh operation of the semiconductor memory device of the present invention, it is assumed that a capacitive load of the memory device needed to transfer the bit signal A0 is indicated by "3C", a capacitive load of the memory device needed to transfer the bit signal A1 is indicated by "2C", and a capacitive load of the memory device needed to transfer the bit signal A2 is indicated by "C".

If the smallest change period T is assigned for the bit signal A0 as the least significant bit (LSB) of the refresh address signal (or T1=T) and the largest change period 4T is assigned for the bit signal A2 as the most significant bit (MSB) of the refresh address signal (or T3=4T), then an average power consumption P1 of the memory device for the refresh cycle time in this case is represented by the equation:

$$P1=(3C\times 4+2C\times 2+C)V^2/4T=17CV^2/4T \quad (1)$$

On the other hand, if the largest change period 4T is assigned for the LSB-position bit signal of the refresh address signal and the smallest change period T is assigned for the MSB-position bit signal of the refresh address signal, then an average power consumption P2 of the memory device for the refresh cycle time in this case is represented by the equation:

$$P2=(C\times 4+2C\times 2+3C)V^2/4T=11CV^2/4T \quad (2)$$

It is apparent from the above equations (1) and (2) that the variations of the capacitive load of the memory device at different addresses thereof must be taken into account, and the required power consumption of the memory device varies depending on how to determine the address of the memory cell to be refreshed in the memory device. Also, in the actual RAM, the capacitive loads at difference addresses of the memory device are different due to the arrangement of the circuit elements (e.g., the word and bit lines or the storage capacitors) or the circuit layout of the memory device.

The power consumption needed during the refresh operation becomes large if the positions of the bit signals in the refresh address signal are retained in a fixed manner without taking account of the variations of the capacitive loads of the memory device at different memory addresses. In order to reduce the required power consumption, the method of generation of the refresh address signal must be adapted so that the positions of the bit signals in the refresh address signal are changed in accordance with the differences of the required device capacitance corresponding to the individual bit signals. In the semiconductor memory device of the present invention, the above-mentioned method of generation of the refresh address signal is incorporated therein.

As previously described, the necessary condition for refreshing the memory cell array in the DRAM is that the refresh operation for a single memory cell in the DRAM is repeated for all the word lines in the DRAM once every refresh cycle. Even if the manner the refresh address signal is generated is modified according to the present invention, the refresh operation for the entire RAM can be carried out without causing any problem.

Figure 3A:
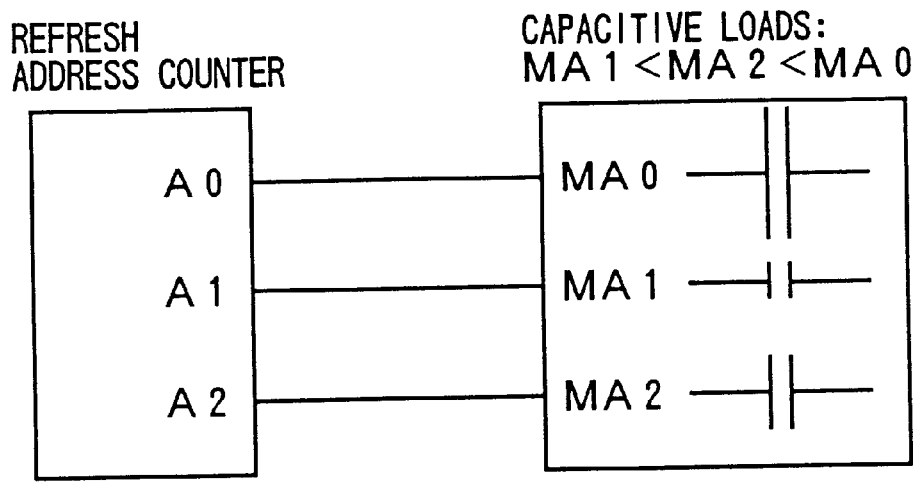
FIG. 3A and FIG. 3B are diagrams for explaining a correspondence between refresh address signal and capacitive load in the semiconductor memory device according to the present invention.
Figure 3B:
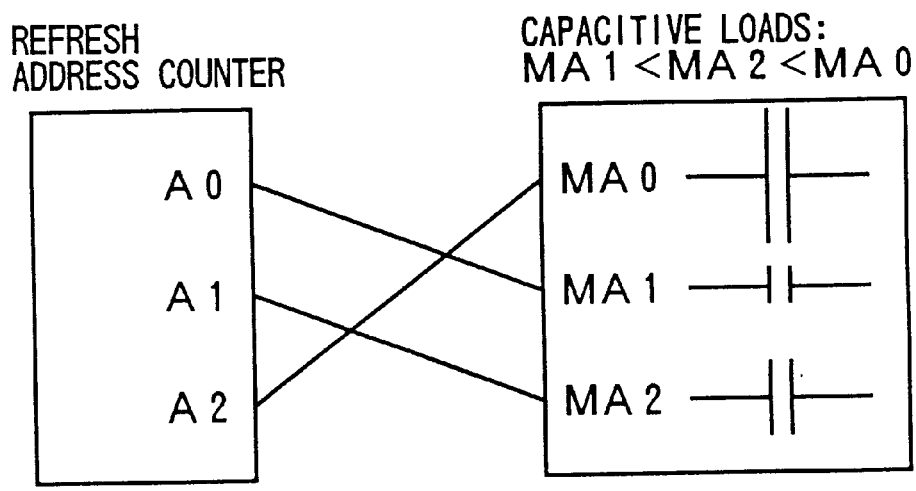

FIG. 3A and FIG. 3B are diagrams for explaining a correspondence between the bit signals of the refresh address signal and the required device capacitances of the semiconductor memory device according to the present invention.

As shown in FIG. 3A, a capacitive load of the semiconductor memory device needed to transfer the bit signal A0 is indicated by "MA0", a capacitive load of the memory device needed to transfer the bit signal A1 is indicated by "MA1", and a capacitive load of the memory device needed to transfer the bit signal A2 is indicated by "MA2". In the cases of FIG. 3A and FIG. 3B, it is assumed that the capacitive loads MA0, MA1 and MA2 of the semiconductor memory device satisfy the conditions MA1<MA2<MA0.

Similarly to the example of FIG. 2, the 3-bit refresh address signal consisting of the bit signals A0, A1 and A2 is used to represent the specific address of the memory cell to be refreshed in the memory device when performing the refresh operation. Further, the bit signal A0 which is initially at the LSB position has the high/low-state change period T and the amplitude V, the bit signal A1 which is initially at the middle position has the high/low-state change period 2T and the amplitude V, and the bit signal A2 which is initially at the MSB position has the high/low-state change period 4T and the amplitude V.

In the example of FIG. 3A, the positions of the bit signals A0, A1 and A2 in the refresh address signal are maintained in a fixed sequence without taking account of the variations of the capacitive load of the semiconductor memory device at the different memory addresses. Specifically, in the example of FIG. 3A, the bit signal A2 having the change period 4T (the largest high/low-state change period) corresponds to the middle capacitive load MA2 of the memory device while the bit signal A0 having the change period T (the smallest high/low-state change period) corresponds to the largest capacitive load MA0 of the memory device.

Figure 4A:
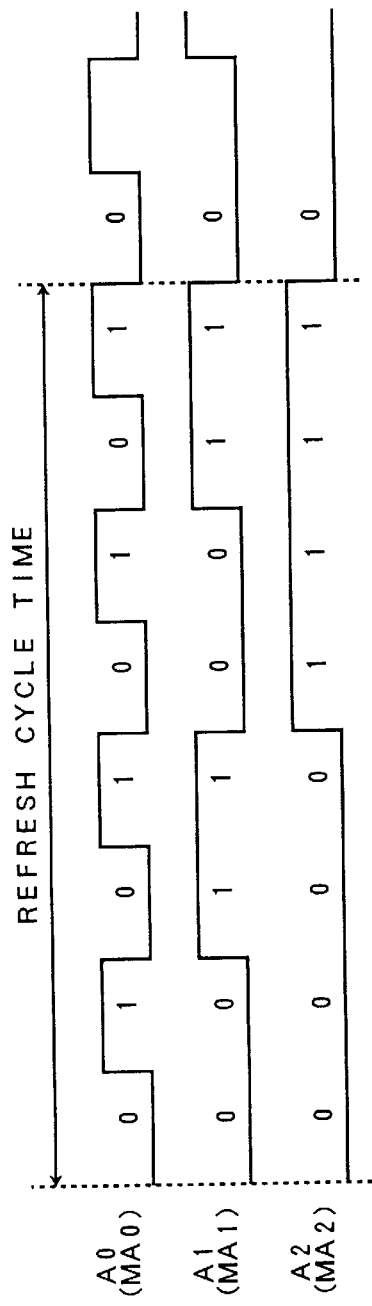
FIG. 4A and FIG. 4B are time charts for explaining a refresh address signal generating method of the present invention in accordance with the correspondence between refresh address signal and capacitive load.

FIG. 4A is a time chart for explaining the sequencing of the refresh operations for the individual memory cells in the semiconductor memory device which is in accordance with the correspondence shown in FIG. 3A.

As shown in FIG. 4A, the refresh operation is started from the memory cell at (0,0,0) and the address of the memory cell to be refreshed in the memory device is incremented in the sequence of (0,0,0), (0,0,1), (0,1,0), . . . , (1,1,1), so as to cover all the memory cells of the semiconductor memory device once within a given refresh cycle time. Hence, a subsequent refresh operation is always started from the memory cell which was first refreshed during the previous refresh cycle, and the address of the memory cell to be refreshed is sequentially incremented. However, as the required capacitive load MA0 of the memory device corresponding to the bit signal A0 having the smallest change period T is the largest, the power consumption required for the memory device when performing the refresh operation will be significantly raised.

FIG. 3B shows a correspondence between the bit signals of the refresh address signal and the required device capacitances of the semiconductor memory device according to the present invention. As shown in FIG. 3B, the correspondence of FIG. 3A is modified. That is, the bit signal A0 corresponds to the smallest capacitive load MA1 of the memory device (or the position of the bit signal A0 in the address signal is changed from the LSB to the middle position), the next bit signal A1 corresponds to the middle capacitive load MA2 of the memory device (or the position of the bit signal A1 in the address signal is changed from the middle position to the MSB), and the bit signal A2 corresponds to the largest capacitive load MA0 of the memory device (or the position of the bit signal A2 in the address signal is changed from the MSB to the LSB).

In the example of FIG. 3B, the different high/low-state change periods of the bit signals in the refresh address signal are changed in accordance with the differences of the required device capacitance corresponding to the individual bit signals. That is, the smallest high/low-state change period (T) is assigned for the bit signal of the refresh address signal corresponding to the smallest capacitive load (MA1) of the memory device, and the largest high/low-state change period (4T) is assigned for the bit signal of the refresh address signal corresponding to the largest capacitive load (MA0) of the memory device. Therefore, according to the refresh address signal generating method described above, it is possible to minimize the required power consumption of the semiconductor memory device of the present invention.

Figure 4B:
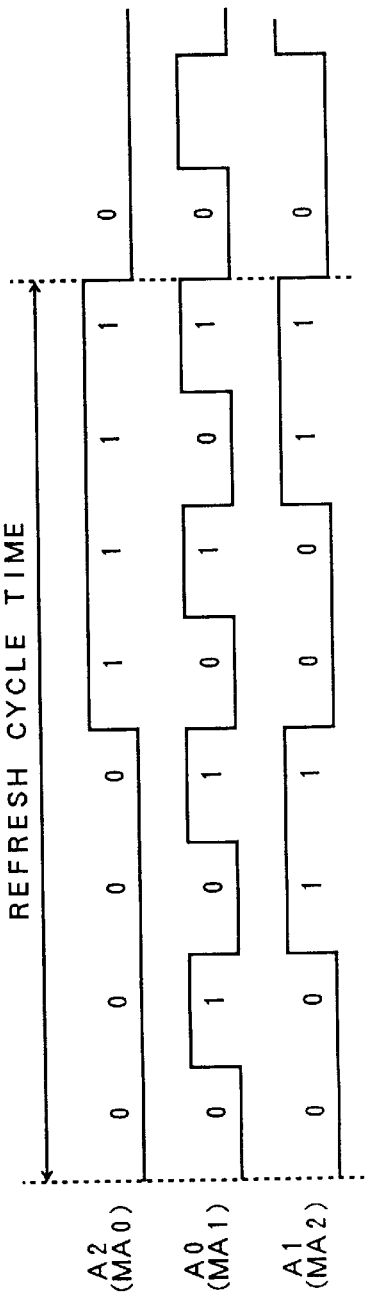

FIG. 4B is a time chart for explaining a refresh address signal generating method of the present invention which is in accordance with the modified correspondence shown in FIG. 3B.

As shown in FIG. 4B, according to the refresh address signal generating method of the present invention, the refresh operation is started from the memory cell at (0,0,0) and the address of the memory cell to be refreshed in the memory device is incremented in the sequence of (0,0,0), (0,1,0), (1,0,0), . . . , (1,1,1), so as to cover all the memory cells of the semiconductor memory device once within a given refresh cycle time. A subsequent refresh operation is always started from the memory cell which was first refreshed during the previous refresh cycle, and the address of the memory cell to be refreshed is sequentially incremented. Even if the manner the refresh address signal is generated is modified according to the present invention, the refresh operation for the entire RAM can be carried out without causing any problem. Further, the largest capacitive load MA0 of the memory device corresponds to the bit signal A2 having the largest change period 4T, the power consumption required for the memory device during the refresh operation can be effectively reduced.

Next, a description will be given of the preferred embodiments of the present invention with reference to the accompanying drawings of FIG. 5 and FIG. 6.

Figure 5:
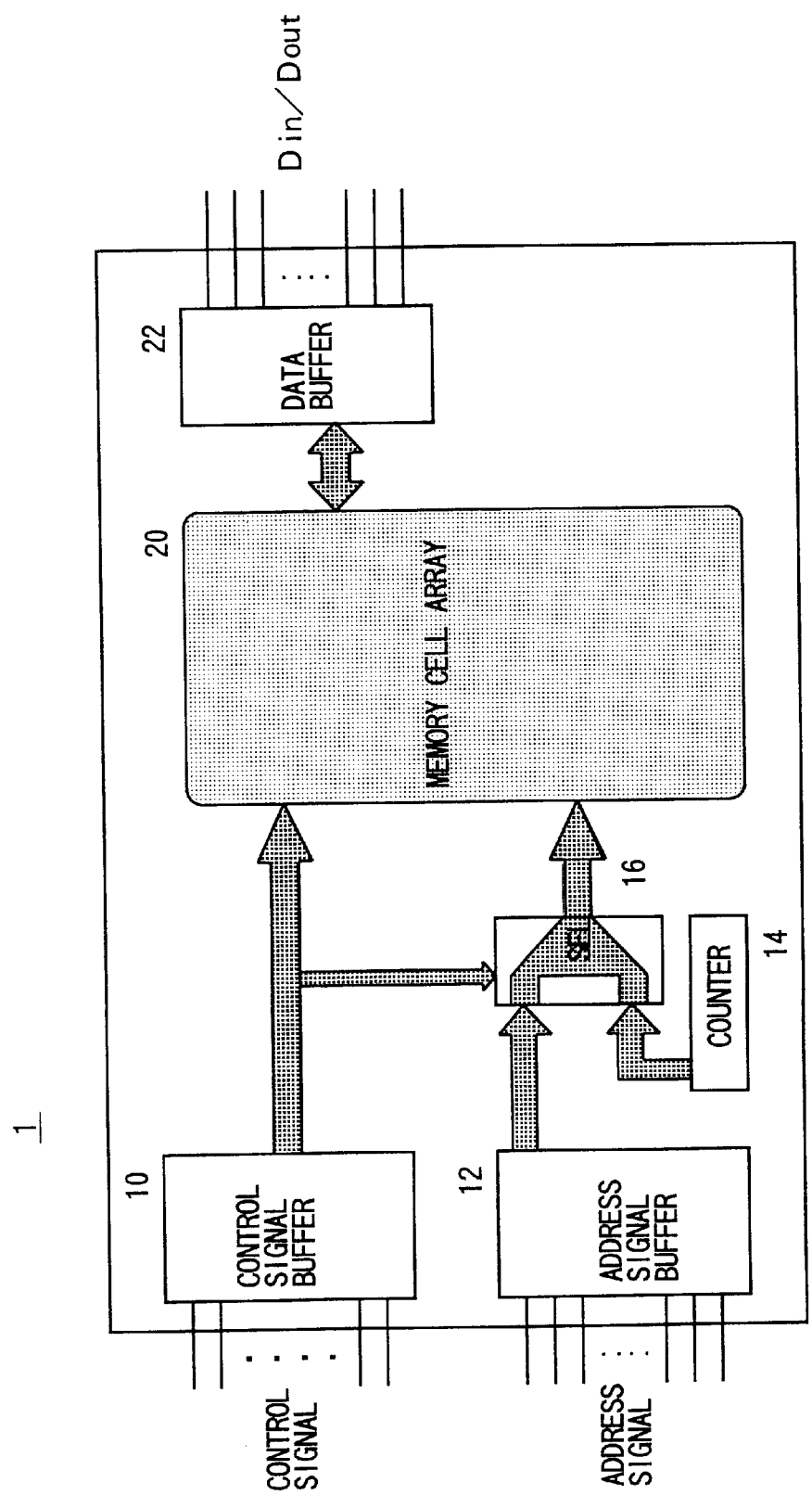
FIG. 5 is a block diagram of an embodiment of the semiconductor memory device of the present invention.

FIG. 5 shows a preferred embodiment of the semiconductor memory device of the invention in which the above-described method of generation of the refresh address signal is incorporated.

As shown in FIG. 5, the semiconductor memory device 1 of this embodiment generally has a control signal buffer 10, an address signal buffer 12, a refresh-address counter 14, a selector 16, a memory cell array 20, and a data buffer 22. In the semiconductor memory device 1 of FIG. 5, a control signal is transmitted from an external host system to the buffer 10, and the received control signal is stored in the buffer 10. An address signal is transmitted from the external host system to the buffer 12, and the received address signal is stored in the buffer 12. The refresh address counter 14 outputs an n-bit refresh address signal consisting of "n" bit signals.

In the semiconductor memory device 1 of FIG. 5, the memory cell array 20 contains a large number of memory cells which are configured in a square or rectangular array on the integrated circuit chip. In the memory cell array 20, a single bit line is shared by many memory cells. Also, a single word line is shared by many memory cells. By running the word and bit lines in orthogonal directions, only one memory cell shares the combination of a given word and bit line. This orthogonal configuration of control lines allows a two-level hierarchical addressing scheme. One level selects a single word line (which is called a row). The second addressing level selects a single bit line (which is called a column).

In the semiconductor memory device 1 of FIG. 5, when input data Din is transmitted from an external system to the data buffer 22, the received data is stored in the buffer 22 and exchanged between the memory cell array 20 and the buffer 22. Also, when output data Dout is transmitted from the array 20 to an external system, the output data is temporarily stored in the buffer 22 and transmitted from the buffer 22 to the external system. Other features of the semiconductor memory device 1 are essentially the same as those of a known semiconductor memory device except the refresh address generating method is incorporated into the semiconductor memory device 1.

When the refresh operation is performed on the semiconductor memory device 1, the refresh address counter 14 outputs an n-bit refresh address signal consisting of "n" bit signals. Similar to the example of FIG. 3B, the memory cell array 20 has predetermined capacitive loads which are different at different memory locations, the capacitive loads including a smallest capacitive load and a largest capacitive load. In the design phase of the semiconductor memory device 1, the predetermined capacitive loads of the memory cell array 20 are measured in advance. The refresh address signal output by the counter 14 indicates a row address of the memory cell to be refreshed in the memory device 1, the bit signals having predetermined high/low-state change periods which are different from each other, the "n" bit signals including a first bit signal corresponding to the smallest capacitive load and a second bit signal corresponding to the largest capacitive load.

As shown in FIG. 5, the selector 16 is provided to connect the outputs of the refresh address counter 14 to the memory cell array 20. During the refresh operation, the selector 16 is controlled in accordance with the control signal retained by the buffer 10, so that the selector 16 assigns the predetermined high/low-state change periods for the respective bit signals of the refresh address signal in accordance with a correspondence between the bit signals and the capacitive loads such that a smallest high/low-state change period (e.g., "T") is assigned for the first bit signal corresponding to the smallest capacitive load and a largest high/low-state change period (e.g., "$2^{(n-1)}$") is assigned for the second bit signal corresponding to the largest capacitive load. The semiconductor memory device 1 of the present embodiment is effective in reducing the power consumption required when performing the refresh operation. The reduction of the power consumption according to the present embodiment makes it possible to increase an useful life of a portable electronic system which incorporates the semiconductor memory device 1 of the present embodiment.

In the above-described embodiment of FIG. 5, the selector 16 is controlled to assign the predetermined high/low-state change periods for the respective bit signals of the refresh address signal in accordance with the correspondence between the bit signals and the capacitive loads. Alternatively, a wiring pattern on the integrated circuit chip may be used by the semiconductor memory device 1, instead of the selector 16. On the integrated circuit chip of the semiconductor memory device 1, the wiring pattern connects the outputs of the refresh address counter 14 to the memory cell array 20 to assign the predetermined high/low-state change periods for the respective bit signals of the refresh address signal in accordance with the correspondence between the bit signals and the capacitive loads.

Figure 6:
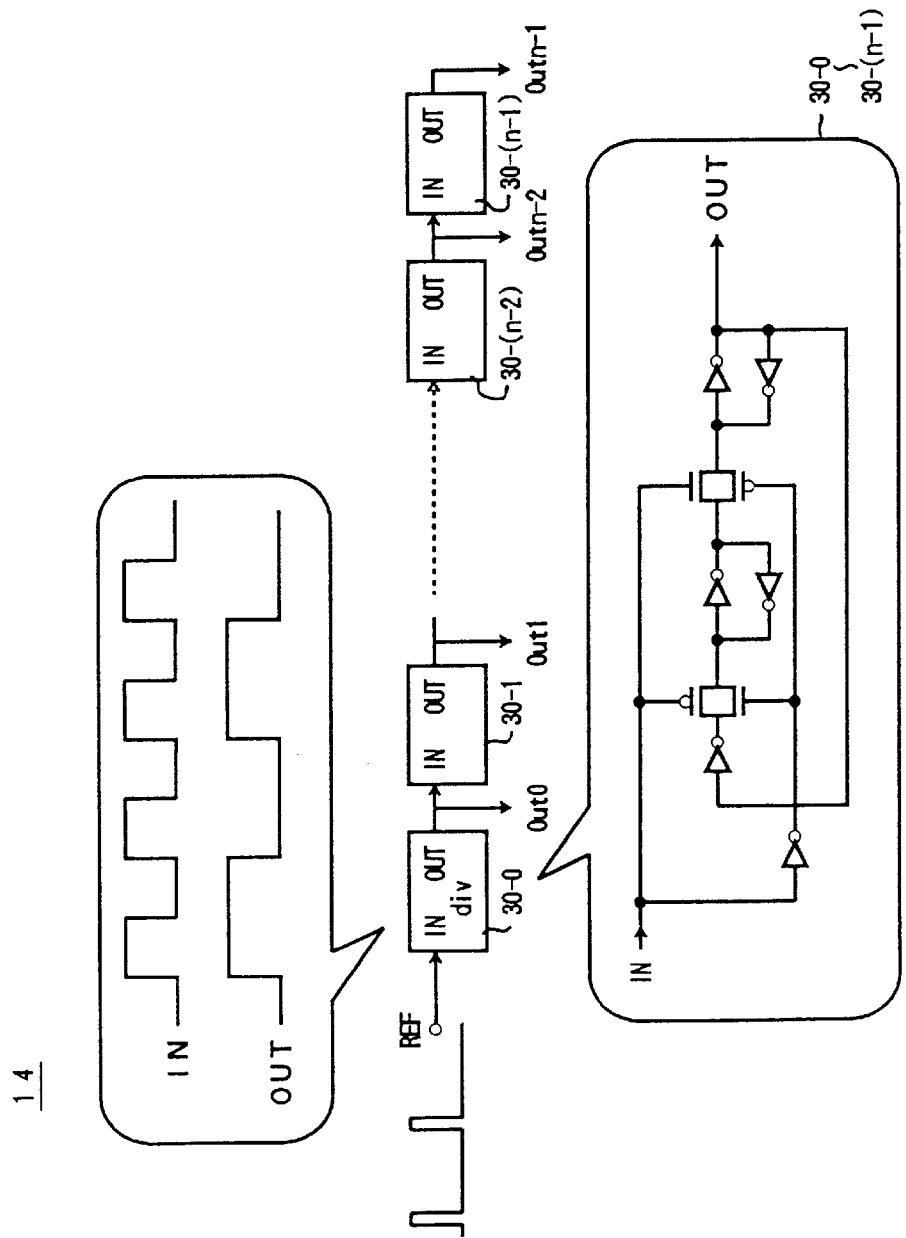
FIG. 6 is a diagram showing a refresh address counter in the semiconductor memory device of the present invention.

FIG. 6 shows a refresh address counter 14 in the semiconductor memory device of the present invention.

As shown in FIG. 6, the refresh address counter 14 includes a plurality of frequency dividers 30-0 through 30-(n−1) which are connected in series. The refresh address counter 14 includes an input terminal REF connected to the input of the frequency divider 30-0. For example, each of the frequency dividers 30-0 through 30-(n−1) is configured by using the configuration of circuit elements shown in FIG. 6.

When the refresh operation is performed on the semiconductor memory device, a binary pulsed signal is supplied to the frequency dividers 30-0 through 30-(n−1) via the input terminal REF. The frequency divider 30-0 receives the pulsed signal and outputs a frequency-divided pulsed signal (or a refresh address bit signal A0) to an output terminal OUT0. The frequency-divided pulsed signal is supplied also to the frequency divider 30-1. The frequency divider 30-1 receives the frequency-divided pulse signal and outputs a further frequency-divided pulsed signal (or a refresh address bit signal A1) to an output terminal OUT1. The frequency-divided pulsed signal is supplied also to the frequency divider 30-2. These procedures are repeated for all the frequency dividers 30-0 through 30-(n−1).

In the refresh address counter 14 of FIG. 6, the "n" bit signals A0 through A(n−1) of the refresh address signal are respectively output from the output terminals OUT0 through OUT(n−1) of the frequency dividers 30-0 through 30-(n−1). On the phase of designing of the semiconductor memory device, the capacitive loads of the memory cell array 20 at the different memory locations are measured in advance. As the correspondence between the bit signals and the capacitive loads can be obtained as the results of the measurement of the capacitive loads, the above-described selector or wiring pattern can be provided to connect the outputs OUT0 through OUT(n−1) of the refresh address counter 14 to the memory cell array 20 in order to assign the predetermined high/low-state change periods for the respective bit signals of the refresh address signal in accordance with the correspondence between the bit signals and the capacitive loads.

During the refresh operation, the selector 16 or the wiring pattern is controlled in accordance with the control signal retained by the buffer 10, so that the predetermined high/low-state change periods are assigned for the respective bit signals of the refresh address signal in accordance with the correspondence between the bit signals and the capacitive loads such that the smallest high/low-state change period is assigned for the first bit signal corresponding to the smallest capacitive load and the largest high/low-state change period is assigned for the second bit signal corresponding to the largest capacitive load. The semiconductor memory device 1 of the present embodiment is effective in reducing the power consumption required when performing the refresh operation. The reduction of the power consumption according to the present embodiment makes it possible to increase an useful life of a portable electronic system which incorporates the semiconductor memory device of the present embodiment.

The present invention is not limited to the above-described embodiments, and variations and modifications may be made without departing from the scope of the present invention.

Further, the present invention is based on Japanese priority application No.11-109,929, filed on Apr. 16, 1999, the entire contents of which are hereby incorporated by reference.

What is claimed is:

1. A semiconductor memory device in which memory cells are periodically refreshed to an activated level, comprising:

a memory cell array having a number of memory cells configured in a square or rectangular formation, the memory cell array having predetermined capacitive loads which are different at different memory locations, the capacitive loads including a smallest capacitive load and a largest capacitive load;

a refresh address counter which outputs a number of bit signals which constitute a refresh address signal, the refresh address signal indicating an address of a memory cell to be refreshed in the memory device, the bit signals having predetermined high/low-state change periods which are different from each other, the bit signals including a first bit signal corresponding to the smallest capacitive load and a second bit signal corresponding to the largest capacitive load; and a selector, provided to connect the outputs of the refresh address counter to the memory cell array, which assigns the predetermined high/low-state change periods for the respective bit signals of the refresh address signal in accordance with a correspondence between the bit signals and the capacitive loads such that a smallest high/low-state change period is assigned for the first bit signal corresponding to the smallest capacitive load and a largest high/low-state change period is assigned for the second bit signal corresponding to the largest capacitive load.

2. The semiconductor memory device according to claim 1, wherein the refresh address counter includes a plurality of frequency dividers which are connected in series, the frequency dividers having a plurality of output terminals, and the bit signals of the refresh address signal are respectively output from the output terminals of the frequency dividers.

3. A semiconductor memory device in which memory cells are periodically refreshed to an activated level, comprising:

a memory cell array having a number of memory cells configured in rows and columns, the memory cell array having predetermined capacitive loads which are different at different memory locations, the capacitive loads including a smallest capacitive load and a largest capacitive load;

a refresh address counter which outputs a number of bit signals which constitute a refresh address signal, the refresh address signal indicating a row address of a memory cell to be refreshed in the memory device, the bit signals having predetermined high/low-state change periods which are different from each other, the bit signals including a first bit signal corresponding to the smallest capacitive load and a second bit signal corresponding to the largest capacitive load; and a wiring pattern which connects the outputs of the refresh address counter to the memory cell array to assign the predetermined high/low-state change periods for the respective bit signals of the refresh address signal in accordance with a correspondence between the bit signals and the capacitive loads.

4. The semiconductor memory device according to claim 3, wherein the wiring pattern connects the outputs of the refresh address counter to the memory cell array such that a smallest high/low-state change period is assigned for the first bit signal corresponding to the smallest capacitive load and a largest high/low-state change period is assigned for the second bit signal corresponding to the largest capacitive load.

5. A refresh address signal generating method for periodically refreshing a semiconductor memory device to an activated level within a refresh cycle time, comprising the steps of:

provanceiding a memory cell array having a number of memory cells configured in a square or rectangular formation, the memory cell array having predetermined capacitive loads which are different at different memory locations, the capacitive loads including a smallest capacitive load and a largest capacitive load;

outputting a number of bit signals which constitute a refresh address signal, the refresh address signal indicating an address of a memory cell to be refreshed in the memory device, the bit signals having predetermined high/low-state change periods which are different from each other, the bit signals including a first bit signal corresponding to the smallest capacitive load and a second bit signal corresponding to the largest capacitive load; and assigning the predetermined high/low-state change periods for the respective bit signals of the refresh address signal in accordance with a correspondence between the bit signals and the capacitive loads such that a smallest high/low-state change period is assigned for the first bit signal corresponding to the smallest capacitive load and a largest high/low-state change period is assigned for the second bit signal corresponding to the largest capacitive load.

* * * * *

UNITED STATES PATENT AND TRADEMARK OFFICE
CERTIFICATE OF CORRECTION

PATENT NO. : 6,195,304 B1  Page 1 of 1
DATED : February 27, 2001
INVENTOR(S) : Satoshi Eto et al.

It is certified that error appears in the above-identified patent and that said Letters Patent is hereby corrected as shown below:

Title page:
Change (75) "Masato MATSUYIMA" to -- Masato MATSUMIYA --

Signed and Sealed this

Fourteenth Day of August, 2001

*Attest:*

*Attesting Officer*

NICHOLAS P. GODICI
*Acting Director of the United States Patent and Trademark Office*